United States Patent
Kapoor

(10) Patent No.: US 7,453,107 B1
(45) Date of Patent: Nov. 18, 2008

(54) METHOD FOR APPLYING A STRESS LAYER TO A SEMICONDUCTOR DEVICE AND DEVICE FORMED THEREFROM

(75) Inventor: Ashok K. Kapoor, Palo Alto, CA (US)

(73) Assignee: DSM Solutions, Inc., Los Gatos, CA (US)

( * ) Notice: Subject to any disclaimer, the term of this patent is extended or adjusted under 35 U.S.C. 154(b) by 0 days.

(21) Appl. No.: 11/744,617

(22) Filed: May 4, 2007

(51) Int. Cl.
 H01L 29/80 (2006.01)
 H01L 31/112 (2006.01)
 H01L 29/423 (2006.01)
 H01L 29/74 (2006.01)
 H01L 31/111 (2006.01)
 H01L 29/00 (2006.01)

(52) U.S. Cl. .................. 257/285; 257/134; 257/135; 257/136; 257/256; 257/272; 257/280; 257/281; 257/282; 257/283; 257/284; 257/504

(58) Field of Classification Search ......... 257/134–136, 257/256, 272, 280–285, 504
See application file for complete search history.

(56) References Cited

U.S. PATENT DOCUMENTS

| | | | | |
|---|---|---|---|---|
| 5,473,176 A * | 12/1995 | Kakumoto | ............... | 257/192 |
| 5,804,849 A * | 9/1998 | Wennekers | ............... | 257/280 |
| 5,869,856 A * | 2/1999 | Kasahara | ............... | 257/287 |
| 6,251,738 B1 | 6/2001 | Huang | ............... | 438/312 |
| 6,271,550 B1 * | 8/2001 | Gehrmann | ............... | 257/285 |
| 6,580,107 B2 * | 6/2003 | Asano et al. | ............... | 257/282 |
| 6,710,403 B2 * | 3/2004 | Sapp | ............... | 257/330 |
| 7,312,481 B2 * | 12/2007 | Chen et al. | ............... | 257/134 |
| 2004/0026765 A1 | 1/2004 | Currie et al. | ............... | 257/616 |
| 2004/0113217 A1 | 6/2004 | Chidambarro et al. | ...... | 257/415 |
| 2006/0134893 A1 | 6/2006 | Savage et al. | ............... | 438/483 |
| 2006/0163581 A1 | 7/2006 | Suvkhanov | ............... | 257/65 |
| 2006/0252194 A1 | 11/2006 | Lim et al. | ............... | 438/199 |
| 2007/0096144 A1 | 5/2007 | Kapoor | ............... | 257/134 |
| 2007/0138515 A1 * | 6/2007 | Winslow | ............... | 257/280 |
| 2007/0284626 A1 * | 12/2007 | Vora et al. | ............... | 257/256 |

OTHER PUBLICATIONS

Matthew T. Currie, *2004 IEEE International Conference on Integrated Circuit Design and Technology*, IEEE, 2004 "Strained Silicon: Engineered Substrates and Device Integration," pp. 261-268.

(Continued)

*Primary Examiner*—Ida M Soward
(74) *Attorney, Agent, or Firm*—Baker Botts L.L.P.

(57) ABSTRACT

A semiconductor device includes a substrate of semiconductor material. A source region, a drain region, and a conducting region of the semiconductor device are formed in the substrate and doped with a first type of impurities. The conducting region is operable to conduct current between the drain region and the source region when the semiconductor device is operating in an on state. A gate region is also formed in the substrate and doped with a second type of impurities. The gate region abuts a channel region of the conducting region. A stress layer is deposited on at least a portion of the conducting region. The stress layer applies a stress to the conducting region along a boundary of the conducting region that strains at least a portion of the conducting region.

20 Claims, 13 Drawing Sheets

OTHER PUBLICATIONS

*Dielectric and semiconductor materials, devices, and processing—ecs transactions—SiGe and Ge: Materials, Processing, and Devices*, ECS Transactions, vol. 3, No. 7, "Strained Si/SiGe Heterostructures on Insulator," 2006, pp. 9-11.

PCT Notification of Transmittal of the International Search Report and The Written Opinion of the International Searching Authority, or the Declaration with attached International Search Report and the Written Opinion of the International Searching Authority in International Application No. PCT/US2008/061119, 11 pages, Jul. 18, 2008.

* cited by examiner

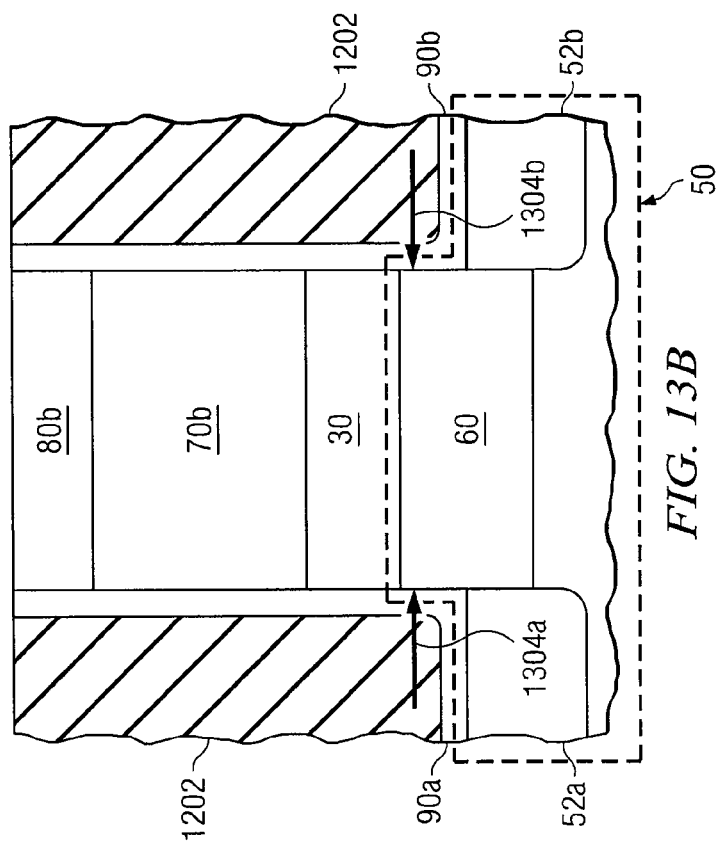
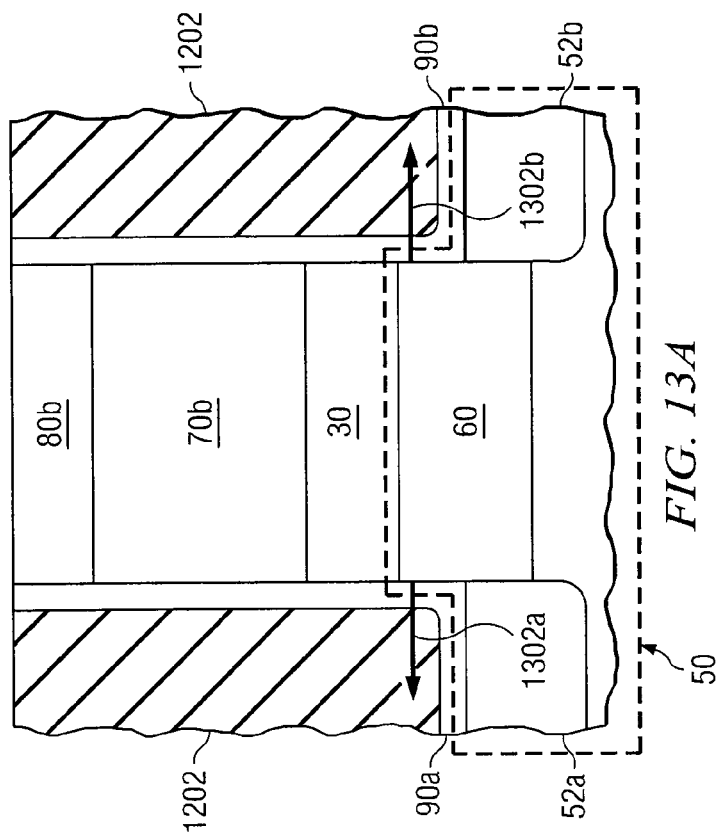

US 7,453,107 B1

METHOD FOR APPLYING A STRESS LAYER TO A SEMICONDUCTOR DEVICE AND DEVICE FORMED THEREFROM

TECHNICAL FIELD OF THE INVENTION

This invention relates, in general, to semiconductor devices and, more particularly, to devices utilizing strained semiconductor material.

BACKGROUND OF THE INVENTION

As a result of the rapid technological growth of the past several decades, transistors and other semiconductor devices have become a fundamental building block for a wide range electronic components. Metal-oxide silicon field-effect transistors (MOSFET) have been the primary choice for transistors in many applications including general-use microprocessors, digital signal processors, application specific integrated circuits (ASICs) and various other forms of electronic devices. With the demand for electronic devices that are increasingly smaller and faster, the inclusion of the metal oxide layer from which MOSFETs derive their name creates significant limitations to further improvements in the size and operating speed of such devices.

As a result, the focus of industry development has begun to shifts to junction field effect transistors (JFETs) and other types of semiconductor devices.

SUMMARY OF THE INVENTION

In accordance with the present invention, the disadvantages and problems associated with prior semiconductor devices have been substantially reduced or eliminated.

In accordance with one embodiment of the present invention, A semiconductor device includes a substrate of semiconductor material. A source region, a drain region, and a conducting region of the semiconductor device are formed in the substrate and doped with a first type of impurities. The conducting region, comprising a channel region, is operable to conduct current between the drain region and the source region when the semiconductor device is operating in an on state. A gate region is also formed in the substrate and doped with a second type of impurities. The gate region abuts the channel region of the conducting region. A stress layer is deposited on at least a portion of the conducting region. The stress layer applies a stress to the conducting region along a boundary of the conducting region that strains at least a portion of the conducting region.

Technical advantages of certain embodiments of the present invention include providing a semiconductor device with increased operating speed and reduced power consumption. Other technical advantages of the present invention will be readily apparent to one skilled in the art from the following figures, descriptions, and claims. Additionally, while specific advantages have been enumerated above, various embodiments may include all, some, or none of the enumerated advantages. The following technical advantages may be achieved by some, none, or all of the embodiments of the present invention.

BRIEF DESCRIPTION OF THE DRAWINGS

For a more complete understanding of the present invention and its advantages, reference is now made to the following descriptions, taken in conjunction with the accompanying drawings, in which:

FIGS. 2-12 and 13A and 13B illustrate various steps in a method for fabricating the semiconductor device of FIG. 1.

DETAILED DESCRIPTION OF THE INVENTION

Figure 1:
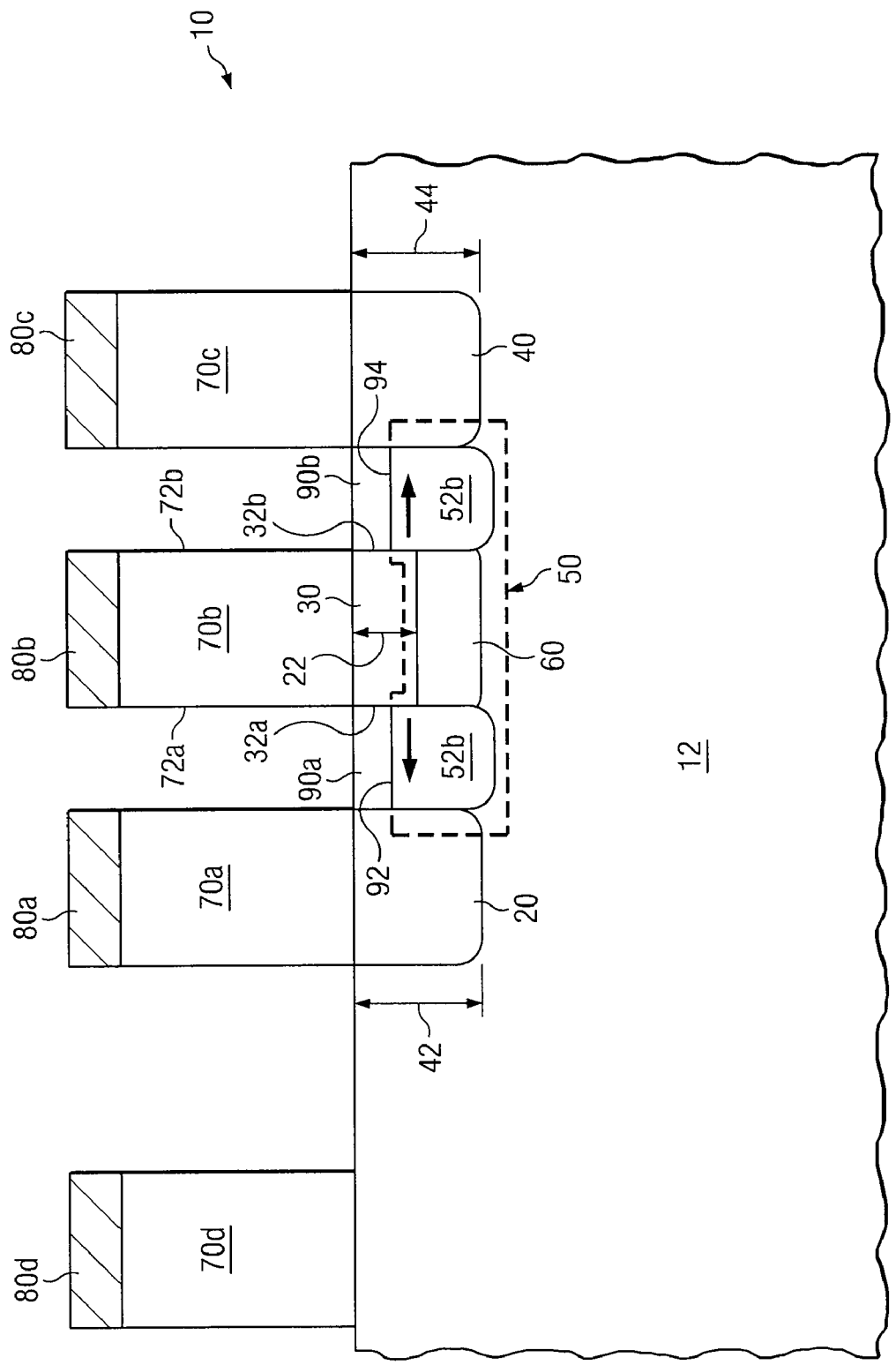
FIG. 1 illustrates a semiconductor device according to a particular embodiment of the present invention.

FIG. 1 shows a cross-sectional view of a semiconductor device 10 according to a particular embodiment of the present invention. As shown in FIG. 1, semiconductor device 10 includes a substrate 12, a source region 20, a gate region 30, a drain region 40, a conducting region 50, polysilicon regions 70a-d, and contacts 80a-d. Additionally, conducting region 50 includes link regions 52a-b and a channel region 60. In general, voltages applied to contacts 80a-d of semiconductor device 10 affect the conductivity of channel region 60 and, when appropriate voltages are applied to contacts 80a-d, a current flows between source region 20 and drain region 40 through conducting region 50. While semiconductor device 10 may represent any appropriate form of electronic device that has the described structure and/or provides the described functionality, in particular embodiments, semiconductor device 10 represents a junction field-effect transistor (JFET).

As discussed in more detail below, a stress layer 90 deposited on semiconductor device 10 may apply a strain to conducting region 50, thereby straining the semiconductor material of conducting region 50. This strain may increase the mobility of charge carriers in channel region 60 and/or other portions of conducting region 50. The improvement in charge mobility may, in turn, allow semiconductor device 10 to switch states (e.g., turn on and turn off) more quickly and operate with lower power consumption.

Turning to FIG. 1, substrate 12 represents bulk semiconductor material to which dopants can be added to form various conductivity regions (e.g., source region 20, gate region 30, drain region 40, and channel region 60). Substrate 12 may be formed of any suitable semiconductor material, such as materials from Group III and Group V of the periodic table. In particular embodiments, substrate 12 is formed of single-crystal silicon. Substrate 12 may have a particular conductivity type, such as p-type or n-type. In particular embodiments, semiconductor device 10 may represent a portion of a substrate 12 that is shared by a plurality of different semiconductor devices (not illustrated). For example, in particular embodiments, a complementary pair of semiconductor devices 10 having differing polarities may share the same substrate 12 with a first semiconductor device 10 being formed in a well having a different polarity from the remainder of substrate 12.

Source region 20 and drain region 40 each comprise regions of substrate 12 formed by the addition of a first type of impurities to substrate 12. For example, the first type of impurities may represent particles of n-type doping material such as antimony, arsenic, phosphorous, or any other appropriate n-type dopant. Alternatively, the first type of impurity may represent particles of p-type doping material such as boron, gallium, indium, or any other suitable p-type dopant. In particular, source region 20 and drain region 40 are doped with the same type of impurities as channel region 60. Thus, for an n-type channel semiconductor device 10, source region 20 and drain region 40 are doped with n-type impurities. For a p-type semiconductor device 10, source region 20 and drain region 40 are doped with p-type impurities. In particular embodiments, source region 20 and drain region 40 have a doping concentration higher than $5 \times 10^{19}$ cm$^{-3}$.

In particular embodiments, source region 20 and drain region 40 are formed by the diffusion of dopants through corresponding polysilicon regions 70a and 70c, respectively, as discussed in further detail below with respect to FIG. 7. Consequently, in such embodiments, the boundaries and/or dimensions of source region 20 and drain region 40 may be precisely controlled. As a result, in particular embodiments, the depth of source region 20 (as indicated by arrow 42) is less than one hundred (100) nanometers (nm), and the depth of drain region 40 (as indicated by arrow 44) is also less than one hundred (100) nm. In certain embodiments, the depths of source region 20 and/or drain region 40 are between twenty (20) and fifty (50) nm. Because of the reduced size of source region 20 and drain region 40, particular embodiments of semiconductor device 10 may provide further reductions in the parasitic capacitance experienced by semiconductor device 10 during operation.

Conducting region 50 comprises a region of substrate 12 that conducts current when semiconductor device 10 is in an on state. Conducting region 50 is doped with n-type or p-type impurities and is of the same polarity as source region 20 and drain region 40. Conducting region 50 includes channel region 60 and link regions 52a and 52b. These various regions of conducting region 50 may be doped with varying levels of impurities. Additionally, as described further below, a stress layer 90 deposited on conducting region 50 applies a stress to conducting region 50 that strains all or a portion of the semiconductor material in conducting region 50, thereby improving the conductivity of conducting region 50.

Link regions 52a and 52b comprise regions of substrate 12 formed by doping substrate 12 with n-type or p-type impurities, as appropriate. In particular embodiments, link regions 52a and 52b are doped using a different technique from that used to dope source region 20 and drain region 40. Because link regions 52a and 52b are of the same conductivity type as source region 20 and drain region 40, however, the boundary between source region 20 and link region 52a and the boundary between drain region 40 and link region 52b may be undetectable once the relevant regions have been formed. For example, in particular embodiments, source region 20 and drain region 40 are formed by diffusing dopants through polysilicon regions 70a and 70c, respectively. Ion implantation is then used to add dopants to appropriate regions of substrate 12, thereby forming link regions 52a and 52b. Because the dopant concentrations for these regions are similar or identical, the boundary between source region 20 and link region 52a and the boundary between drain region 40 and link region 52b are substantially undetectable after semiconductor device 10 has been formed.

Gate region 30 is formed by the addition of a layer of semiconductor material over channel region 60. A second type of impurity is then added to the semiconductor material of gate region 30. As a result, gate region 30 has a second conductivity type. Thus, for an n-type channel semiconductor device 10, gate region 30 is doped with p-type impurities. For a p-type semiconductor device 10, gate region 30 is doped with n-type impurities. In particular embodiments, gate region 30 is doped with the second type of impurity to a concentration higher than $3 \times 10^{19}$ cm$^{-3}$. As described further below, when a voltage is applied to gate region 30, the applied voltage alters the conductivity of the neighboring channel region 60, thereby facilitating or impeding the flow of current between source region 20 and drain region 40. Although FIG. 1 illustrates an embodiment of semiconductor device 10 that includes only a single gate region 30, alternative embodiments may include multiple gate regions 30.

As noted above, semiconductor device 10, in contrast to a MOSFET, does not include an insulating layer (such as silicon dioxide) covering the area in which gate region 30 is to be formed. As a result, gate region 30 may, in particular embodiments, be formed by the diffusion of dopants through a corresponding polysilicon region 70b, as discussed in further detail below with respect to FIG. 7. Consequently, in such embodiments, the boundaries and/or dimensions of gate region 30 may be precisely controlled. As a result, in particular embodiments, the depth of gate region 30 (as shown by arrow 22) may be limited to less than fifty (50) nm. In certain embodiments, the depth of gate region 30 may be between ten (10) and twenty (20) nm.

Additionally, as a result of gate region 30 being formed by the diffusion of dopants through polysilicon region 70b, gate region 30 may be precisely aligned with polysilicon region 70b. More specifically, one or more boundaries of gate region 30 may be substantially aligned with one or more surfaces of the polysilicon region 70b. For example, in particular embodiments, a first boundary 32a of gate region 30 may be aligned with a first boundary 72a of polysilicon region 70b to within ten (10) nm, while a second boundary 32b of gate region 30 may be aligned with a second boundary 72b of polysilicon region 70b to within ten (10) nm. By limiting the amount of gate region 30 that extends beyond the surfaces 72 of polysilicon region 70b, particular embodiments of semiconductor device 10 may provide further reductions in the parasitic capacitance experienced by semiconductor device 10 during operation. Furthermore, the absence of an insulating layer (as would be present in a MOSFET or similar semiconductor device) allows the semiconductor material of gate region 30 to be formed directly on top of channel region 60, so that gate region 30 directly abuts channel region 60.

Channel region 60 comprises a distinct region formed in substrate 12 that abuts gate region 30 and one or more layers of substrate 12. Channel region 60 provides a path to conduct current between source region 20 and drain region 40 through link regions 52a and 52b. Channel region 60 is doped by the addition of a first type of impurities to a region of substrate 12. For example, the first type of impurities may represent particles of n-type doping material such as antimony, arsenic, phosphorous, or any other appropriate n-type dopant. Alternatively, the first type of dopant may represent particles of p-type doping material such as boron, gallium, indium, or any other suitable p-type dopant. In particular embodiments, channel region 60 is doped with n-type impurities, and electrons flow from the source region 20 to the drain region 40 to create a current when an appropriate voltage is applied to semiconductor device 10. In alternative embodiments, channel region 60 is doped with p-type impurities and, when an appropriate voltage is applied to semiconductor device 10, holes flow from source region 20 to drain region 40 to create a current.

In particular embodiments, channel region 60 is doped with a substantially lower concentration of dopants than is used to dope source region 20 and drain region 40. For example, in particular embodiments, channel region 60 is doped with the first type of dopant to a concentration of less than $2.0 \times 10^{19}$ cm$^{-3}$. Because of the relatively shallow depth and relatively low doping of channel region 60, semiconductor device 10 may, in particular embodiments, operate as an enhancement-mode device with a positive current flowing between source region 20 and drain region 40 when a positive voltage differential is applied between gate region 30 and source region 20.

In particular embodiments, channel region 60 may be formed by epitaxial growth of silicon or silicon alloys. As a result, the doping concentration of channel region 60 can be precisely controlled. The dimensions and/or boundaries of channel region 60 may also be precisely controlled. In other embodiments, impurities can be ion implanted in substrate 12 to form channel region 60 with an appropriate doping concentration.

Polysilicon regions 70a-d comprise polysilicon structures that provide an ohmic connection between contacts 80a-d and source region 20, gate region 30, drain region 40, and substrate 12, respectively. In particular embodiments, polysilicon regions 70 may connect pins of an integrated circuit package to the various regions of semiconductor device 10. Furthermore, as described in greater detail below, with respect to FIG. 7, in particular embodiments, source region 20, drain region 40, and gate region 30 are formed by dopants that are diffused through polysilicon regions 70. As a result, in particular embodiments, polysilicon regions 70 may themselves comprise doped material, even after any appropriate diffusion of dopants into the various regions of substrate 12 has occurred. Additionally, in particular embodiments, polysilicon regions 70 may be coplanar. Moreover, contacts 80 may additionally or alternatively be coplanar so that particular surfaces of all contacts 80 have the same height. Coplanar polysilicon regions 70 and/or contacts 80 may simplify the manufacturing and packaging of semiconductor device 10.

Stress layer 90 represents a layer of appropriate material that applies a compressive or tensile force (represented in FIG. 1 by arrows 98a and 98b) to conducting region 50. In particular embodiments, stress layer 90 bonds with channel region 60 at one or more boundaries between stress layer 90 and conducting region 50 (such as boundaries 92 and 94). Additionally, in particular embodiments, semiconductor device 10 does not include spacers or other insulating elements to separate gate region 30 from source region 20 or drain region 40, and stress layer 90 may be applied to semiconductor device 10 in a manner so that stress layer 90 abuts one or more boundaries of channel region 60 directly.

As shown in FIG. 1, stress layer 90 may include multiple different portions neighboring different portions of conducting region 50. For example, in particular embodiments, stress layer 90 may include portions 90a and 90b abutting conducting region 50 along boundaries 92 and 94 on either side of channel region 60 and gate region 30. As a result, the tensile or compressive force applied by stress layer 90 may be applied to multiple surfaces of and/or locations within conducting region 50, allowing greater control over the effect of stress layer 90 on conducting region 50.

Stress layer 90 may represent a layer of any material suitable to apply a stress to conducting region 50 when applied adjacent to or abutting conducting region 50. As one example, in particular embodiments, stress layer 90 may be comprised of a material that has a different thermal expansion rate than some or all of the remainder of semiconductor device 10. During subsequent steps in the fabrication of such embodiments, the temperature of semiconductor device 10 is reduced causing portions of semiconductor device 10 to shrink. For example, in particular embodiments, once certain steps in the fabrication of semiconductor have been completed, semiconductor device 10 is allowed to cool. Because the material of stress layer 90 shrinks at a different rate than the semiconductor material in link regions 52a and 52b and/or other portions of substrate 12, stress layer 90 may stretch or compress a portion of conducting region 50 abutting stress layer 90. As a result, at least a portion of the semiconductor material in conducting region 50 may become strained. As noted above, this may improve carrier mobility in particular embodiments of semiconductor device 10.

In particular embodiments, stress layer 90 may be comprised of a material (such as silicon nitride) that has a greater thermal expansion coefficient than some or all of the semiconductor material of substrate 12. Additionally, this layer of silicon nitride may bond with portions of conducting region 50 at boundaries 92 and 94 between stress layer 90 and conducting region 50. Because stress layer 90 has a greater thermal expansion coefficient than substrate 12, stress layer 90 contracts more rapidly than substrate 12 when cooling. Furthermore, because conducting region 50 is abutting and bonded to stress layer 90, conducting region 50 experiences a tensile stress as a result of this contraction. This tensile stress strains the semiconductor material of conducting region 50.

Alternatively, by controlling conditions such as the flow rate, pressure, temperature, or rate of deposition, or (in enhanced CVD) the frequency for generating plasma in particular embodiments, stress layer 90 may be generated with a material that has a smaller thermal expansion coefficient than some or all of the semiconductor material in substrate 12. For example, by controlling some or all of these conditions, a layer of silicon nitride may be deposited having a smaller thermal expansion coefficient from the semiconductor material in substrate 12. Because stress layer 90 has a smaller thermal expansion coefficient than substrate 12, stress layer 90 contracts less rapidly than substrate 12 when cooling. Furthermore, because conducting region 50 abuts stress layer 90, portions of conducting region 60 (including, in particular embodiments, channel region 60) may experience a compressive stress as a result of the reduced contraction of stress layer 90 relative to some or all of the remainder of substrate 12. This compressive stress strains the semiconductor material of conducting region 50.

Additionally, in particular embodiments, different stress layers 90 may be applied to various portions of semiconductor device 10. For example, in particular embodiments, semiconductor device 10 may comprise multiple transistors, such as a complementary n-type and p-type transistor pair isolated from one another via appropriate p-type and n-type well structures. In such embodiments, a first stress layer 90 may be applied to the n-type transistor to apply a tensile stress to the conducting region 50 of the n-type transistor. This tensile stress may induce a strain in the n-type conducting region 50 that improves the mobility of electrons through the region. A second stress layer 90 may be applied to the p-type transistor to apply a compressive stress to the conducting region 50 of the p-type transistor. This compressive stress may induce a strain in the p-type conducting region 50 that improves the mobility of holes through the region. As a result, different stress layers 90 can be applied to different types of conducting region 50 to improve the mobility of the appropriate charge carrier for that conducting region 50.

In operation, conducting region 50 provides a voltage-controlled conductivity path between source region 20 and drain region 40 through link regions 52 and channel region 60. More specifically, a voltage differential between gate region 30 and source region 20 (referred to herein as $V_{GS}$) controls channel region 60 by increasing or decreasing a width of a depletion region (not shown) formed along the boundary between channel region 60 and gate region 30. This depletion region defines an area within channel region 60 in which the recombination of holes and electrons has depleted semiconductor device 10 of charge carriers. Because the depletion region lacks charge carriers, the depletion region will impede the flow of current between source region 20 and drain region 40. Moreover, as the depletion region expands and recedes, the portion of channel region 60 through which current can flow grows or shrinks, respectively. As a result, the conductivity of channel region 60 increases and decreases as $V_{GS}$ changes, and semiconductor device 10 may operate as a voltage-controlled current regulator.

Furthermore, in particular embodiments, semiconductor device 10 comprises an enhancement mode device. Thus, when $V_{GS} \leq 0$, depletion region pinches off channel region 60 preventing current from flowing between source region 20 and drain region 40. When $V_{GS} > 0$, depletion region recedes to a point that a current flows between source region 20 and source 40 through conducting region 50 when a positive voltage differential is applied between source region 20 and drain region 40 (referred to herein as $V_{DS}$).

Overall, in particular embodiments, the dimensions of channel region 60, gate region 30, source region 20, and/or drain region 40 may reduce the parasitic capacitances created within semiconductor device 10 and may, as a result, allow semiconductor device 10 to operate with reduced drive current. As a result, one or more semiconductors can be combined onto a microchip to form a memory device, processor, or other appropriate electronic device that is capable of functioning with a reduced operational voltage. For example, in particular embodiments of semiconductor device 10, channel region 60 may conduct current between source region 20 and drain region 40 with a $V_{GS}$ of 0.5V or less. Consequently, electronic devices that include semiconductor device 10 may be capable of operating at higher speed and with lower power consumption than conventional semiconductor devices.

In addition, as noted above, once deposited on conducting region 50 and allowed to cool, stress layer 90 will apply a stress to the semiconductor material in conducting region 50. Because stress layer 90 may have a different thermal coefficient of expansion from semiconductor device 10. As a result, stress layer 90 may shrink at a different rate from the remainder of semiconductor device 10. As a result of this difference in shrinkage rate, stress layer 90 may induce a stress along a boundary of conduction region 50 on which stress layer 90 is deposited. This stress strains the semiconductor material in conducting region 50 thereby reducing the atomic forces that interfere with the movement of charge carriers through the semiconductor material in conducting region 50. As a result, the strained semiconductor material enhances the mobility of charge carriers in conducting region 50 including, in particular embodiments, in channel region 60. Consequently, the strain induced by stress layer 90 allows semiconductor device 10 to switch states (e.g., turn on and turn off) more quickly and operate with lower power consumption.

Thus, certain embodiments of semiconductor device 10 may provide several benefits. Nonetheless, alternative embodiments may provide some, none, or all of these benefits.

Figure 2:
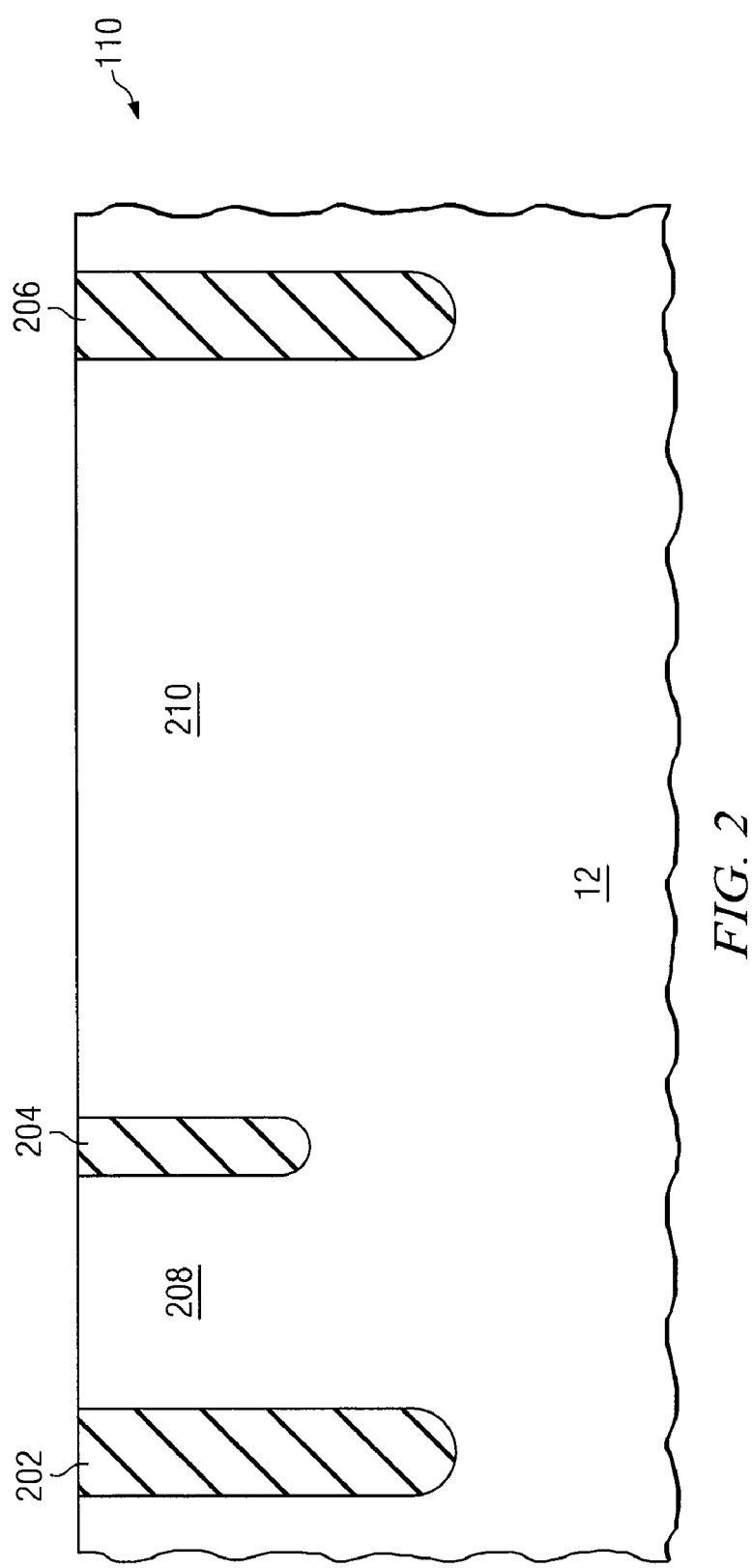

FIGS. 2-12 and 13A and 13B illustrate sample techniques for fabricating a semiconductor device 110, similar in structure and operation to semiconductor device 10 of FIG. 1. In particular, FIG. 2 shows a cross-sectional view of substrate 12 after certain preliminary steps in the example fabrication techniques have been completed to achieve the isolation of various regions where active devices will be formed. Structures 202, 204, and 206 represent Shallow Trench Isolation (STI) structures that are filled with insulating material, such as silicon dioxide and/or nitride and formed to define active regions 208 and 210. Active regions 208 and 210 represent areas of substrate 12 where semiconductor device 110 can be formed. In the fabrication example illustrated in FIGS. 2-12 and 13A-13B, semiconductor device 110 represents an n-type channel JFET, but semiconductor device 110 may represent any type of device appropriate for fabrication using the described techniques. Additionally, as suggested by the jagged boundary of the illustrated portion of substrate 12, semiconductor device 110 may represent one of multiple devices formed in substrate 12.

Figure 3:
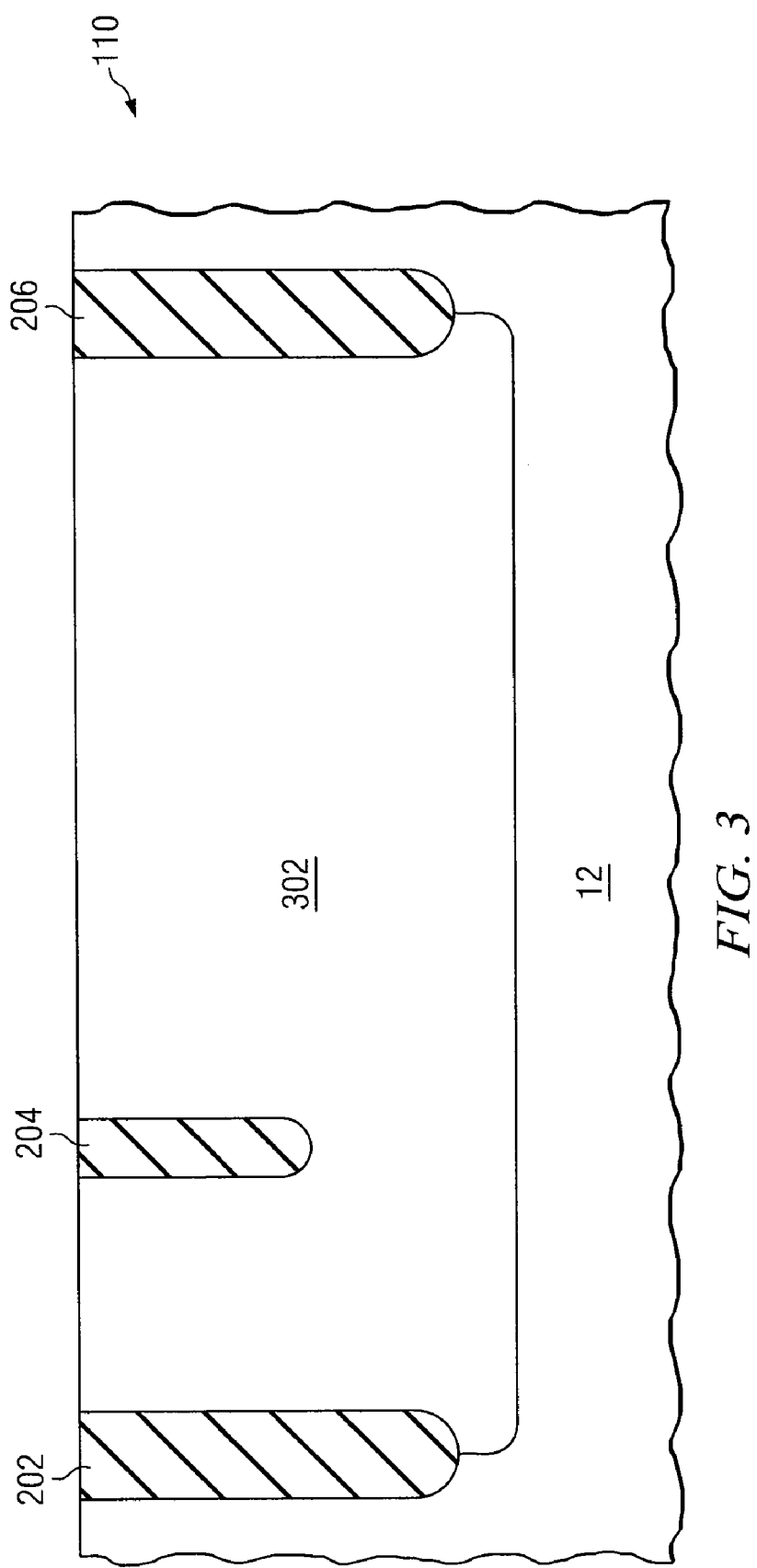

FIG. 3 shows the formation of a well region 302 by doping active region 208 and 210 with appropriate impurities. Well region 302 isolates the semiconductor device 110 to be formed from substrate 12. In the illustrated example, well region 302 represents an n-well. This n-well may be formed using any suitable fabrication technique. For example, phosphorous and/or arsenic atoms may be implanted in well region 302 to form the n-well. These impurities may be implanted to a doping concentration of $1.0 \times 10^{11}/cm^2$ to $1.0 \times 10^{14}/cm^2$ with an energy of implantation ranging from 10 KeV and 400 KeV. In particular embodiments, multiple implants may be used to achieve the desired impurity doping profile. In order to selectively implant regions with impurities, implants may be done using photoresist masks to shield any regions not designed to receive the implant. Additional implants of boron may be provided under structures 202, 204, and 206 to increase the doping in the areas beneath the oxide and prevent any leakage between the adjoining wells. In alternative embodiments, the various regions of semiconductor device 110 can be formed in substrate 12 without using well regions 302 to isolate semiconductor device 110. In such embodiments, the doping steps shown in FIG. 3 may be omitted and/or other suitable modifications to the fabrication process may be made.

Figure 4:
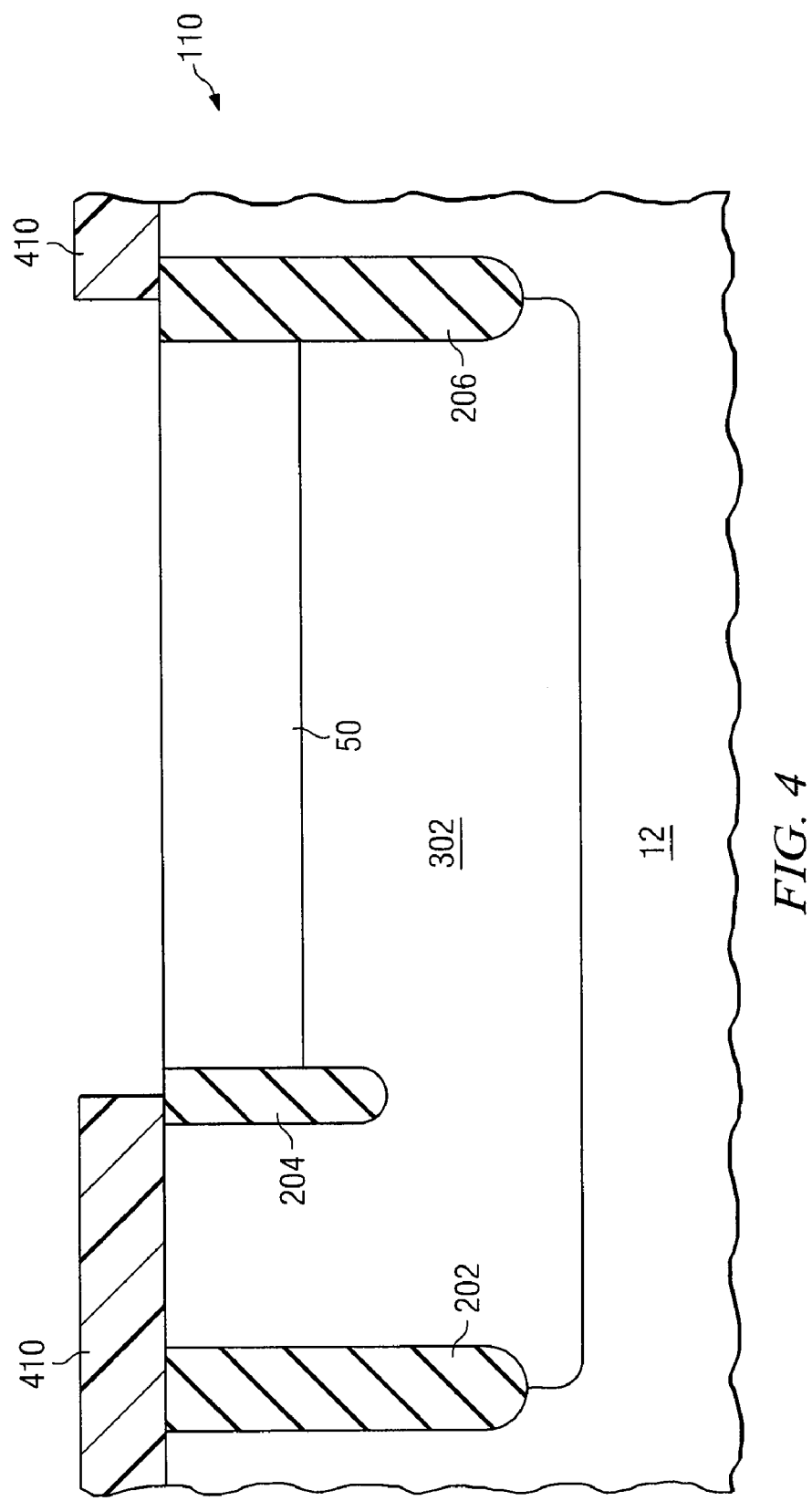
Figure 5:
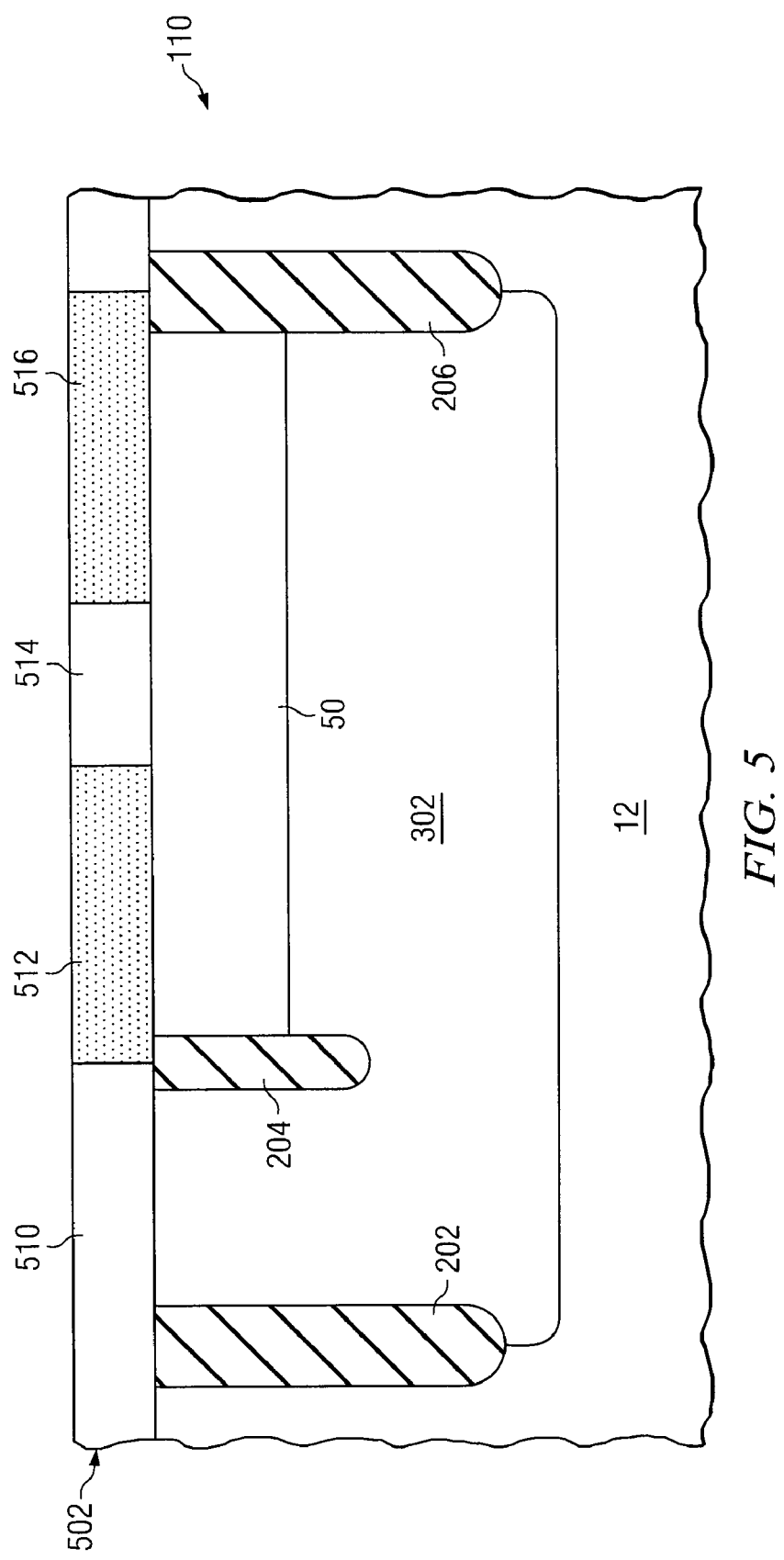

FIG. 4 shows the formation of conducting region 50 in semiconductor device 110. Conducting region 50 may be formed using any fabrication techniques appropriate for semiconductor device 110. In particular embodiments, conducting region 50 may be formed by selective implantation using photoresist masks. For example, for the n-type semiconductor device 110 shown in FIG. 4, conducting region 50 may be formed using an n-type dopant such as arsenic, phosphorous, or antimony with photoresist 410 covering the regions where n-type implants are to be blocked as shown in FIG. 4. Photoresist 410 may then be removed following implantation (as shown in FIG. 5). In alternative embodiments, conducting region 50 may be formed by plasma immersion doping. In yet other embodiments, conducting region 50 may be formed by epitaxial growth (using, e.g., silicon). In such embodiments, conducting region 50 may be doped by selective doping following growth of the relevant layers or doped during deposition by methods such as atomic layer epitaxy.

FIG. 5 illustrates the deposition of a polysilicon layer 502 over substrate 12. In particular embodiments, the thickness of polysilicon layer 502 varies between 100 Å and 10,000 Å. Using photoresist to mask appropriate portions of substrate 12, polysilicon layer 502 may be selectively doped to form the regions which will eventually become the source, drain, gate, and well contacts of semiconductor device 110. The details of the photolithographic process are omitted here for the sake of brevity.

Polysilicon region 510 is designed to act as the contact for well region 302 of semiconductor device 110. Because, in the illustrate example, semiconductor device 110 is an n-type channel device, polysilicon region 510 is doped with a heavy boron implant to a dose ranging between $1 \times 10^{13}/cm^2$ and $1 \times 10^{16}/cm^2$. Polysilicon region 514 is designed to act as the gate contact for semiconductor device 1410 and, in this example, is doped heavily p-type with the parameters similar to those of polysilicon region 510. Polysilicon regions 512 and 516 are doped heavily with n-type impurities (such as phosphorous, arsenic, and antimony) to a dose ranging between $1 \times 10^{13}/cm^2$ and $1 \times 10^{16}/cm^2$ and are designed to act as the source and drain contacts of semiconductor device 110 (contacts 80a and 80b in FIG. 1), respectively. In alternative embodiments, a layer of oxide may be deposited on top of polysilicon layer 502 before ion implantation is performed.

The thickness of this oxide layer may vary between 20 Å and 500 Å. In other embodiments, layers of both oxide and nitride may be deposited on top of polysilicon layer 510 prior to ion implantation, with the thickness of the oxide and nitride films varying between 10 Å and 500 Å each.

Figure 6:
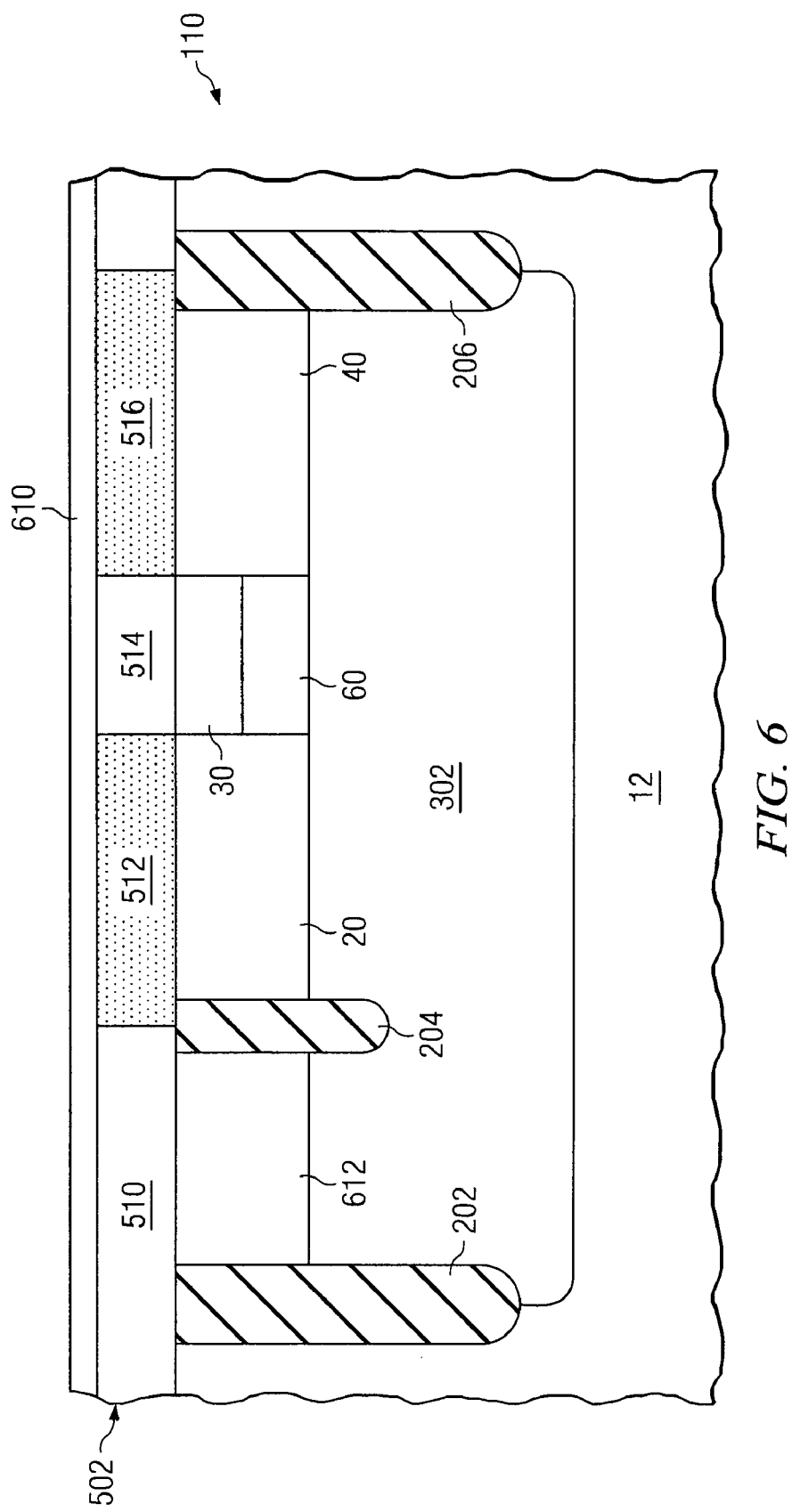

FIG. 6 shows a cross-sectional view of substrate 12 with polysilicon layer 502 doped with impurities and a protective layer 610 on top of polysilicon layer 510. The impurities implanted in various regions of polysilicon layer 510 (e.g., during the example steps shown in FIG. 5) are used as a source of dopants for indirect diffusion into substrate 12 to form source region 20, gate region 30, and drain region 40 of semiconductor device 110. In particular, source region 20 and drain region 40 contain impurities of a first type of dopants (in the illustrated example, n-type) diffused from polysilicon regions 512 and 516, respectively. Additionally, gate region 30 is formed by the diffusion of a second type of impurities (in the illustrated example, p-type) from polysilicon region 514. Additionally, a well tap 612 may be doped by diffusion from polysilicon region 510, and subsequently polysilicon region 510 may form an ohmic contact to well tap 612. In alternative embodiments, multiple ion implants, varying the implant dose and energy and the implanted dopant type, are made into polysilicon regions 510, 512, 514, and 516 to form well tap 612, source region 20, gate region 30, and drain region 40.

Figure 7:
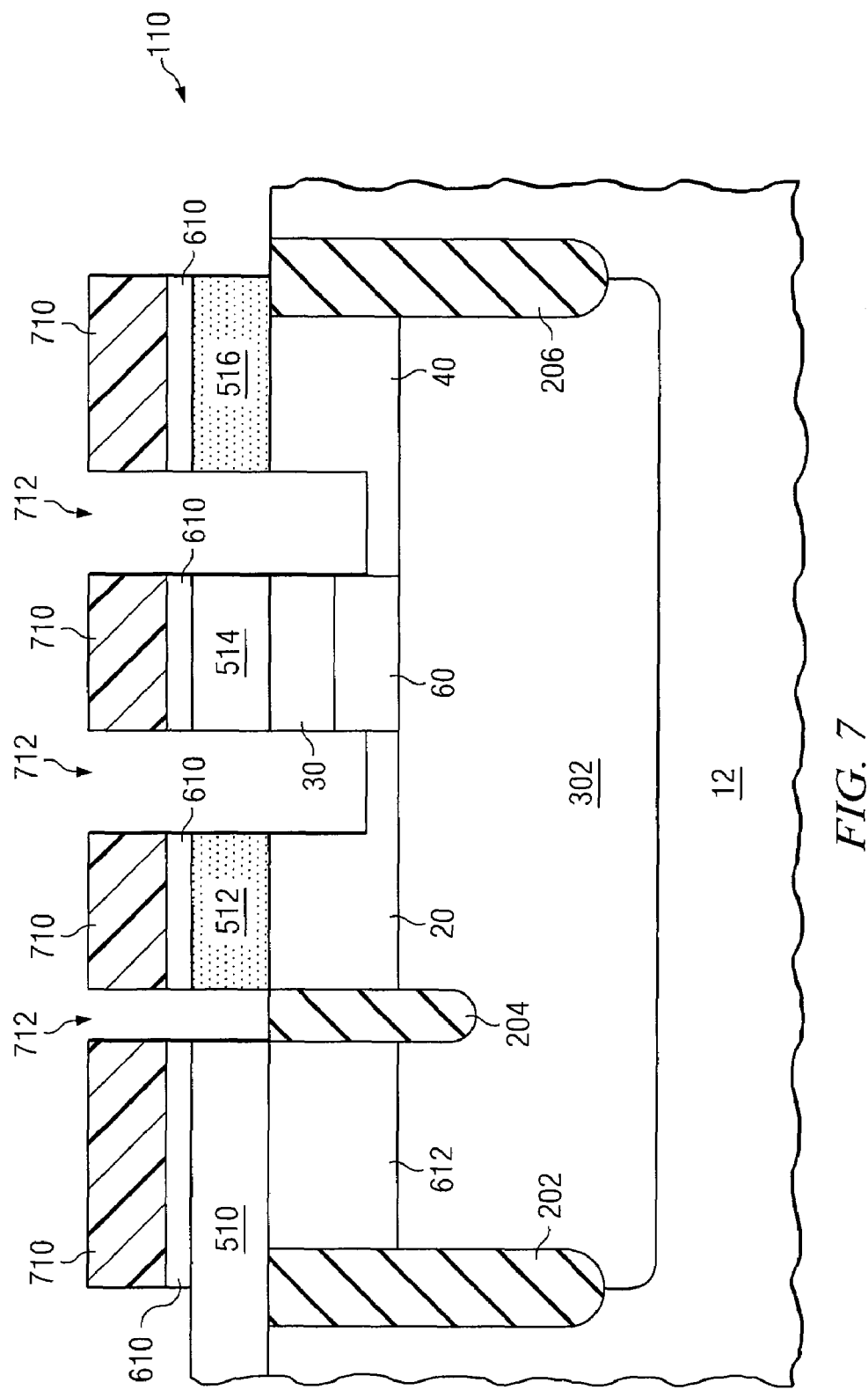

FIG. 7 illustrates a contact patterning process that is performed, in particular embodiments, after the diffusion of dopants into the various regions of substrate 12 (or the completion of alternative doping steps). Using an optical lithographic process, a layer of an anti-reflective coating may (if appropriate) be coated on a protective layer, followed by a layer of photoresist. The thickness of these layers depends upon the selection of the photoresist, as is known to those skilled in the art. The photoresist layer is exposed and various terminals are delineated in the photoresist, marked as 710 in FIG. 7. Alternate embodiments of this invention includes other methods of patterning the photoresist, including imprint lithography and e-beam lithography. With the photoresist layer as the mask, the protective layer above the polysilicon is etched first. Next, the polysilicon layer is etched, with one or more grooves 712 reaching the bottom of the polysilicon layer. This step isolates the various terminals electrically. For patterning the photoresist, various processes such as optical lithography, immersion lithography, imprint lithography, direct write e-beam lithography, x-ray lithography, or extreme ultraviolet lithography are used.

In particular embodiments, as shown in FIG. 7, grooves 712 may be etched to a depth deeper than the depth of gate region 30. As a result, a portion or all of one or more boundaries of channel region 60 may be exposed during etching. This may allow stress layer 90 to be applied directly to channel region 60 in subsequent steps, resulting in a stress layer 90 that abuts channel region 60.

Figure 8:
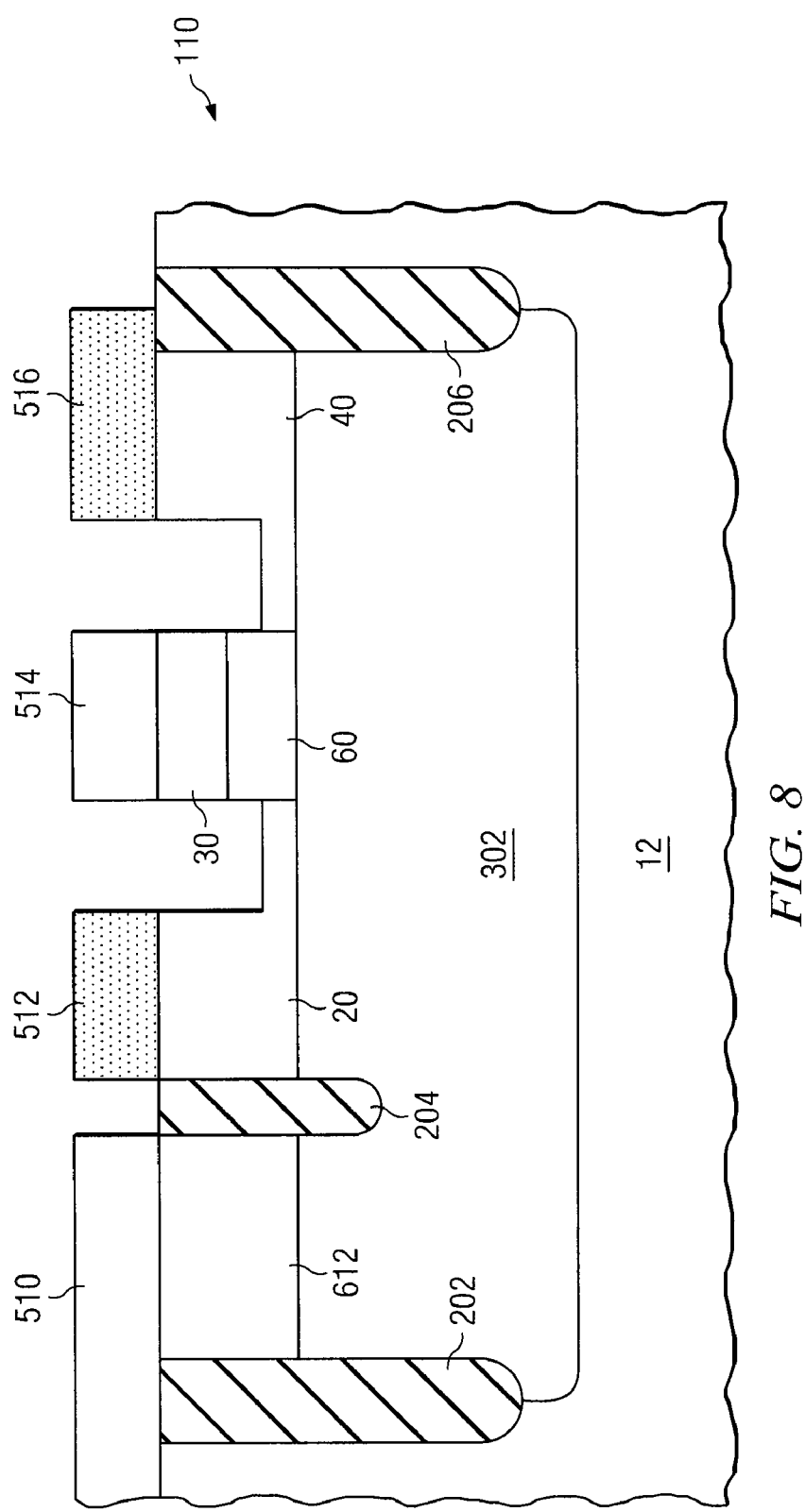

FIG. 8 shows a cross-sectional view of substrate 12 after the areas between channel region 60 and source region 20 and between channel region 60 and drain region 40 have been doped. More specifically, after etching polysilicon layer 510, the area between source region 20 and channel region 60 and the area between drain region 40 and channel region 60 are doped to form a low resistivity path between source region 20 and channel region 60 (referred to here as link region 52a) and between drain region 40 and channel region 60 (referred to here as link region 52b). In the illustrated example, link regions 52a and 52b are formed by the addition of n-type impurities to these regions using a suitable doping process including, but not limited to, ion implantation or plasma immersion implantation. After ion implantation, the dopants are activated by a rapid thermal annealing process. An oxidation step, performed at temperatures ranging between 700C and 950C, may be used to oxidize any regions of silicon that may be damaged during etching. In particular embodiments, link regions 52a and 52b may be formed to a junction depth independent from that of the neighboring source region 20 and drain region 40. Additionally, with the formation of link regions 52a and 52b, a conduction region 50 capable of conducting current between source region 20 and drain region 40 is completed. As discussed with respect to FIG. 1, this conduction region includes channel region 60 and link regions 52a and 52b.

Figure 9:
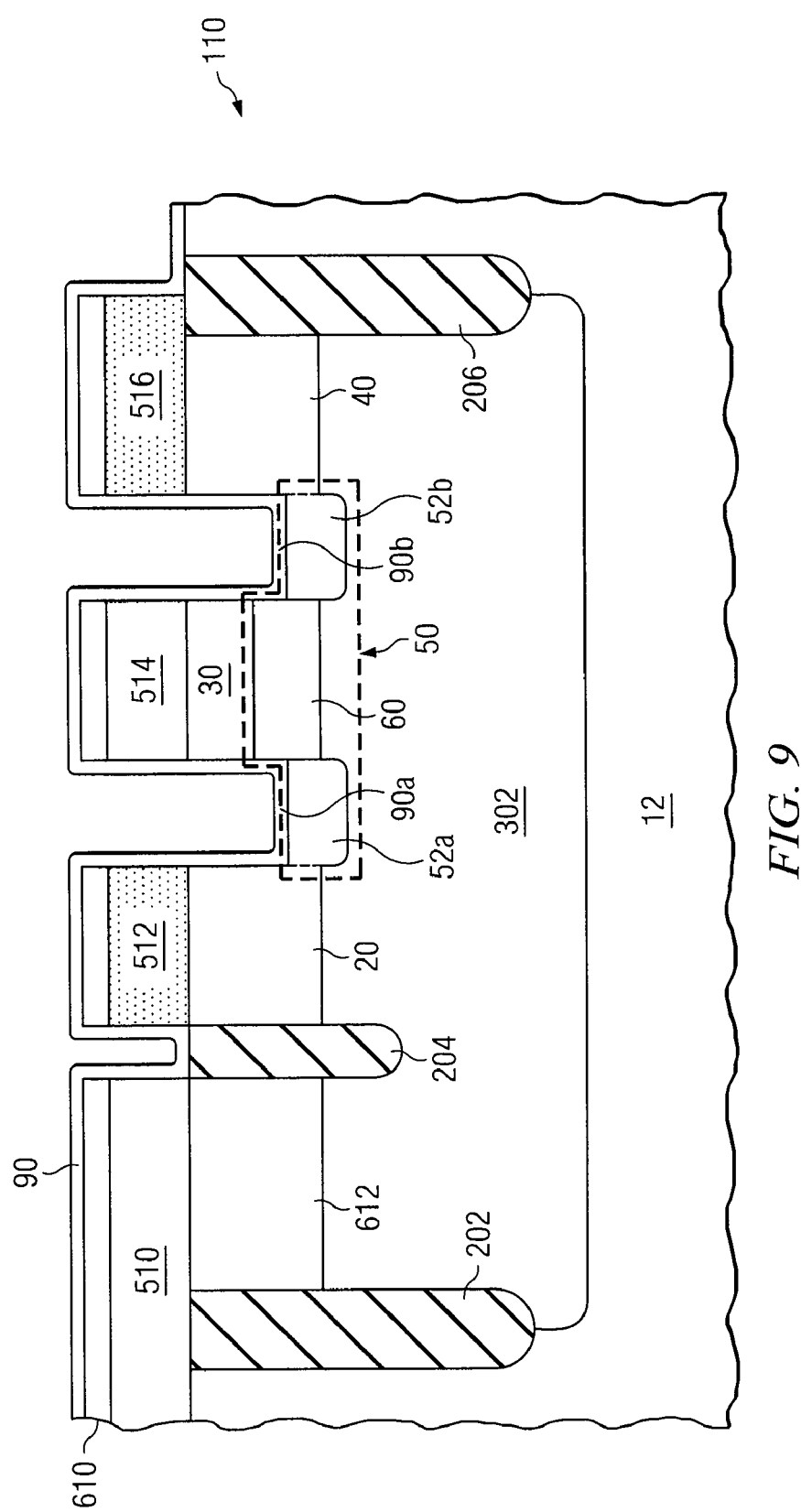

FIG. 9 illustrates the deposition of stress layer 90 to substrate 12. As noted above, stress layer 90 may represent any layer formed on substrate 12 that abuts channel region 60 and is suitable to apply an appropriate stress to channel region 60 once formed. For example, in particular embodiments, stress layer 90 may represent a layer of a semiconductor material (such as silicon nitride) that, during or after fabrication, contracts more than the surrounding semiconductor material creating a tensile stress on channel region 60. As another example, in particular embodiments, stress layer 90 may represent a layer of a material (such as silicon nitride) that is deposited in a manner such that, during or after fabrication, stress layer 90 contracts less than the surrounding semiconductor material creating a compressive stress on channel region 60. The tensile or compressive stress applied by stress layer creates a strain in channel region 60.

Stress layer 90 may be formed using any deposition techniques suitable for this step based on the composition of stress layer 90, substrate 12, and/or other elements of semiconductor device 10. In particular, stress layer 90 may be formed by chemical vapor deposition, physical vapor deposition, molecular beam epitaxy, and/or any other appropriate fabrication techniques. As shown in FIG. 9, stress layer 90 may, in particular embodiments, be applied, in part, in the grooves between polysilicon regions, such as groove 712 between polysilicon regions 512 and 514 and groove 712 between polysilicon regions 514 and 516. Because semiconductor device 110 lacks spacers and/or similar elements designed to isolate gate region 30 (as would be included in a MOSFET or certain other types of transistors), stress layer 90 may, as a result, directly abut channel region 60. This may allow greater control over the strain that is introduced in channel region 60 by stress layer 90.

Furthermore, as noted above, stress layer 90 may, in particular embodiments, comprise multiple portions that may be applied as a single continuous deposition or in selective depositions. For example, in FIG. 9, stress layer 90 includes a first portion 90a that abuts channel region 60 along boundary 92 and second portion 90b that abuts channel region 60 along boundary 94. These boundaries 92 and 94 are formed on either side of channel region 60 and gate region 30.

Figure 10:
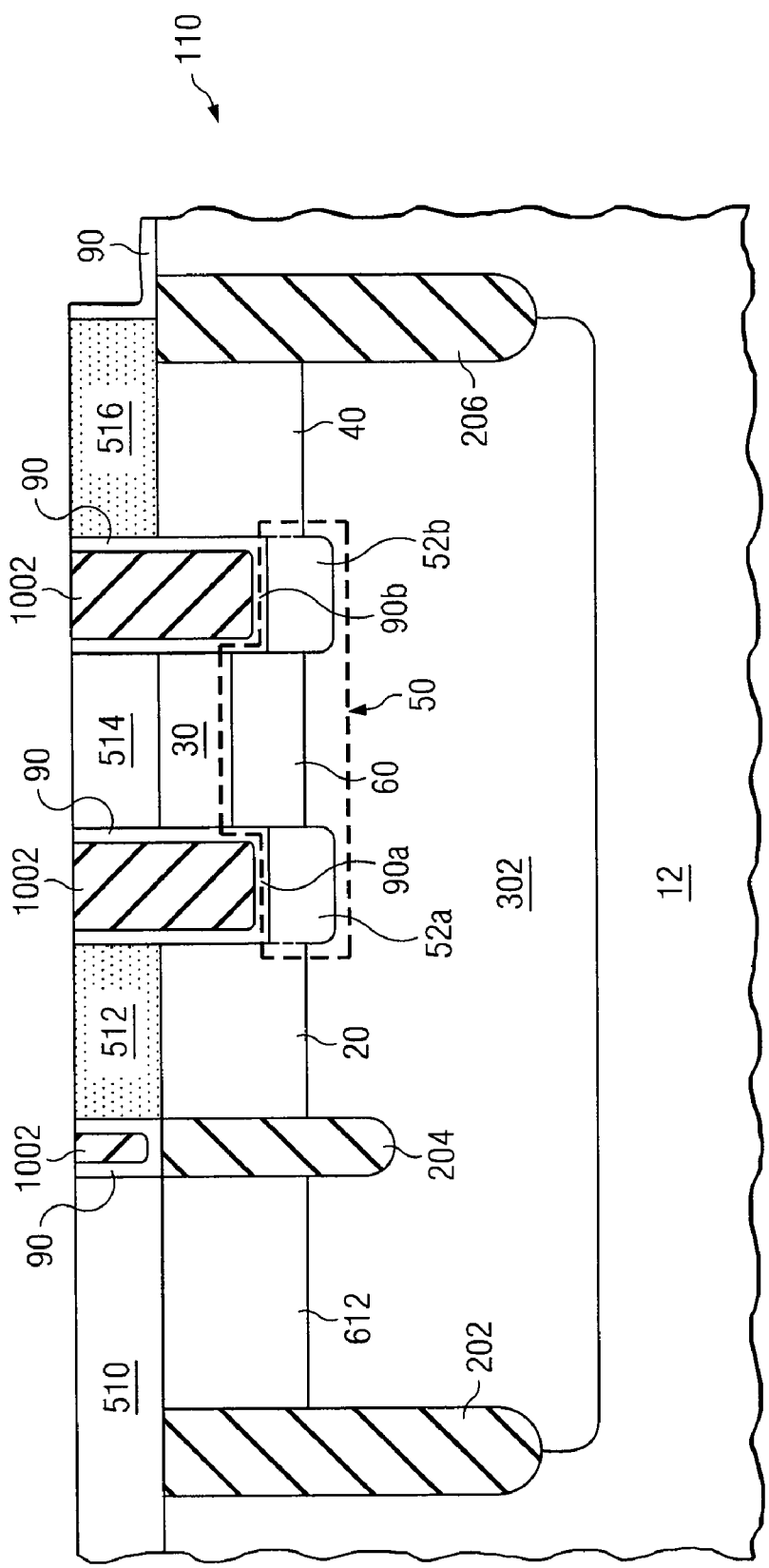

FIG. 10 shows a cross-sectional view of substrate 12 after the gaps between polysilicon regions 510, 512, 514, and 516 are filled with an insulating material 1002 such as silicon dioxide and then processed (e.g., using a method such as chemical-mechanical-polishing) to provide a nearly planar surface at the same level as the polysilicon layer. The technique of filling insulating material 1002 in the gaps between the polysilicon regions 510, 512, 514, and 516 by depositing silicon dioxide using chemical vapor deposition or plasma assisted chemical vapor deposition is one which is widely used in semiconductor manufacturing. One such process employs the deposition of oxide by a low temperature plasma-activated reaction between silane and oxygen in gaseous form.

Additionally, as shown in FIG. 10, the portions of stress layer 90 on top of polysilicon regions 510, 512, 514, and 516 may then be removed to expose the bare polysilicon surface of those regions. Although these portions of stress layer 90 may be removed, at least a portion of stress layer 90 remains on substrate 12. In particular, those portions of stress layer 90 within grooves 712 are left in place to apply a stress to channel region 60. For example, in the example shown in FIG. 10, at least first portion 90a of stress layer 90 and second portions 90b of stress layer 90 abutting channel region 60 remain on substrate 12 after the remainder of stress layer 90 has been removed. The amount of stress layer 90 remaining after the completion of this step may vary depending on the actual techniques used to remove stress layer 90.

Figure 11:
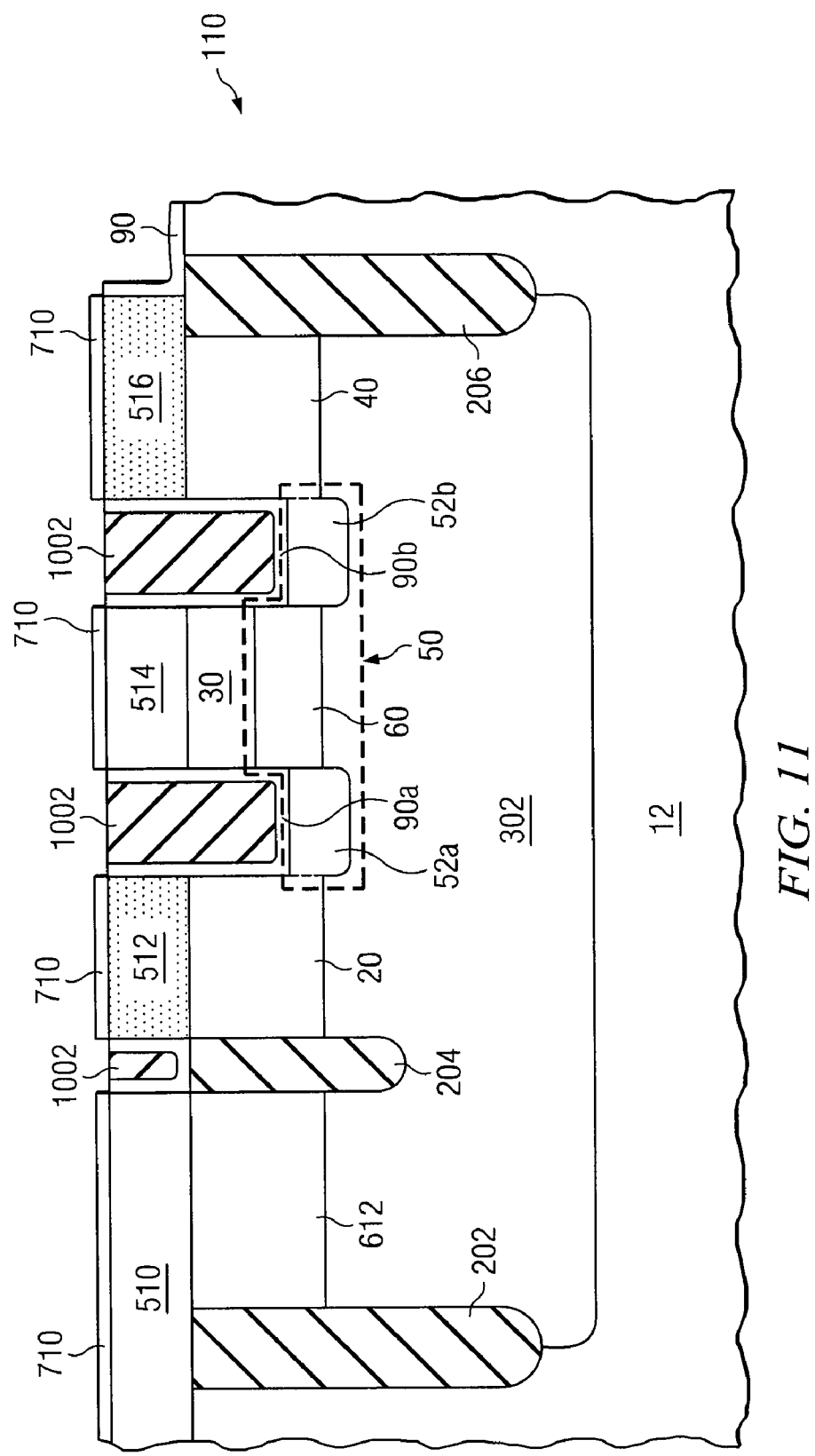

FIG. 11 shows a cross-sectional view of substrate 12 after formation of self aligned silicide on the exposed polysilicon surfaces. A layer of a metal (not shown) such as nickel, cobalt, titanium, platinum, palladium, or other refractory metal is deposited on the polysilicon surface and annealed such that the exposed regions of polysilicon form a metal silicides. As noted above, metal silicides are highly conductive substances. The preferred thickness of the deposited metal is between 50 Å and 1000 Å on an atomically clean surface of polysilicon. The wafers are heated in a rapid anneal furnace at temperatures between 200C and 800C for a time period between 10 seconds and 30 minutes to form silicides selectively where metal is in contact with a silicon or polysilicon layer. In particular embodiments, after the reaction between the metal layer and silicon has taken place, the excess metal is removed from the wafer by a chemical etching process which does not affect the silicide layer. Unreacted metal may be selectively etched off using appropriate solvents, leaving only metal silicide layer 1110 over the exposed polysilicon regions 510, 512, 514, and 516. For titanium and cobalt, a mixture of hydrogen peroxide and ammonium hydroxide may be used in a ratio of 1:0.1 to 1:10 as appropriate at room temperature, although temperatures above room temperatures can also be used. Consequently, in particular embodiments, a self aligned silicide layer 1110 is formed on polysilicon regions 510, 512, 514, and 516 as shown in FIG. 11. Additionally, polysilicon regions 510, 512, 514, and 516 may be used as local interconnects and, thus, this silicided polysilicon may be used for making ohmic contact.

Figure 12:
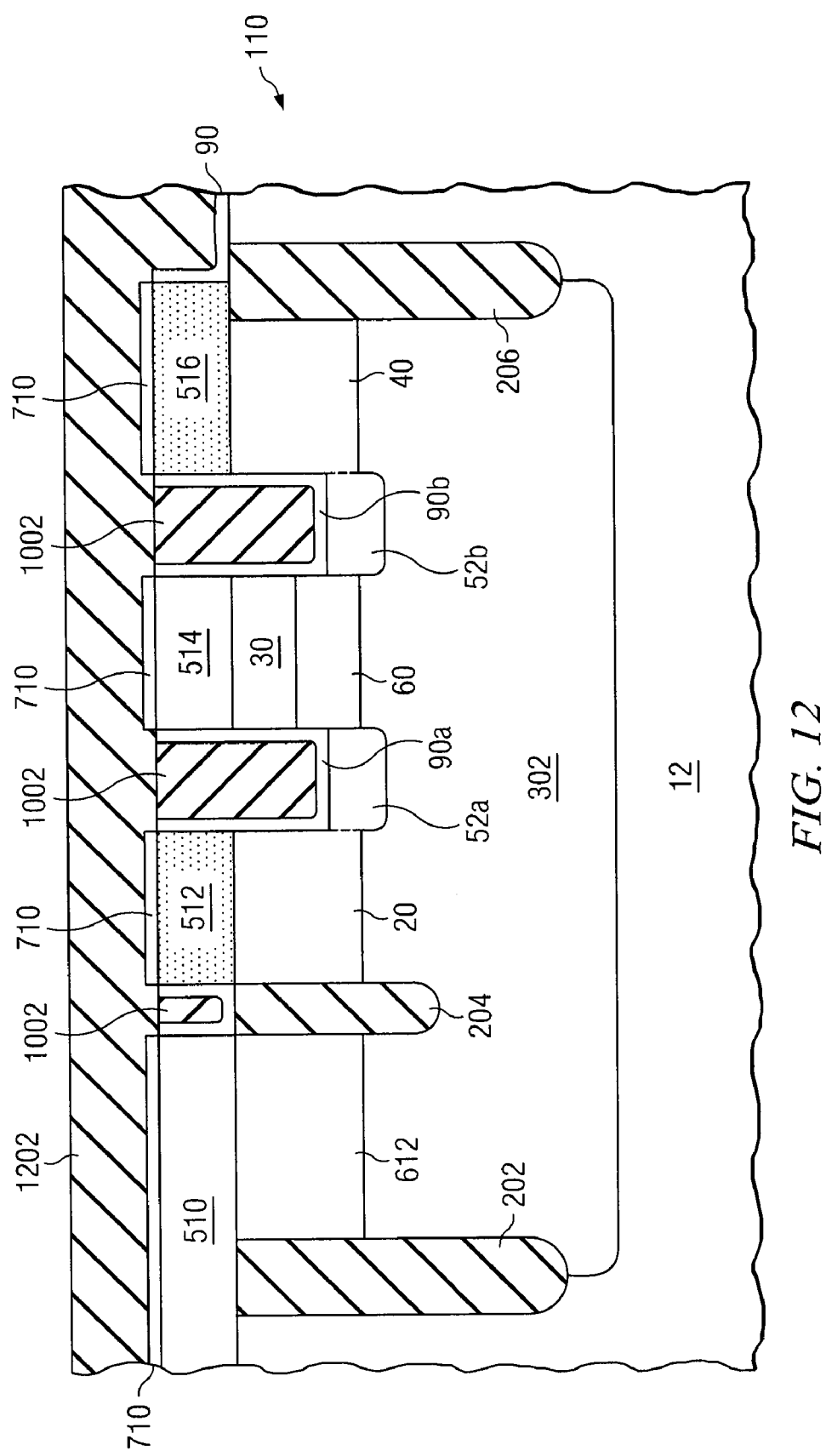

Subsequent fabrication steps may consist of depositing a dielectric (oxide) layer 1202, etching contact holes in dielectric layer 1202, forming contact holes for the source, drain, gate and well tap terminals, and continuing with conventional metal interconnect formation process. A cross-sectional view of substrate 12 after deposition of dielectric layer 1202 and contact hole etch have been performed is shown in FIG. 12. Metal deposition and etch (not shown) may then be performed.

FIGS. 13A and 13B illustrate the semiconductor device 110 formed in FIGS. 2-12 as semiconductor device 110 cools. In particular, FIGS. 13A and 13B illustrate a magnified view of the area surrounding conducting region 50 in semiconductor device 110 as semiconductor device 110 cools. As noted above, semiconductor device 110 may be cooled or allowed to cool at appropriate points during the fabrication process. Thus, although shown in FIGS. 13A and 13B as occurring after the contact hole etch illustrated in FIG. 12 has been completed, the process shown in FIGS. 13A and 13B may occur at any appropriate point or points during the fabrication of semiconductor device 110.

As noted above, as semiconductor device 110 cools, stress layer 90 may, in particular embodiments, shrink at a different rate than other portions of substrate 12 surrounding stress layer 90. Consequently, stress layer 90 may apply a stress to conducting region 50 that strains the semiconductor material of conducting region 50. For example, as illustrated by FIG. 13A, stress layer 90 may, while cooling, shrink more than substrate 12 and, thus, apply a tensile stress (represented in FIG. 13A by arrows 1302a and 1302b) to conducting region 50, similar to that described with respect to FIG. 1. Alternatively, as illustrated by FIG. 13B, stress layer 90 may, while cooling, shrink less than substrate 12 and, thus, apply a compressive stress (represented in FIG. 13B by arrows 1304a and 1304b) to channel region 60. As a result, the semiconductor device 110 fabricated by the techniques illustrated in FIGS. 2-12 is able to provide the benefits described above with respect to FIG. 1.

Although the present invention has been described with several embodiments, a myriad of changes, variations, alterations, transformations, and modifications may be suggested to one skilled in the art, and it is intended that the present invention encompass such changes, variations, alterations, transformations, and modifications as fall within the scope of the appended claims.

What is claimed is:

1. A semiconductor device, comprising:
a substrate formed of semiconductor material;
a source region formed in the substrate and doped with a first type of impurities;
a drain region formed in the substrate and doped with the first type of impurities, the drain region spaced apart from the source region;
a conducting region formed between the source region and the drain region and doped with the first type of impurities, the conducting region operable to conduct current between the drain region and the source region when the semiconductor device is operating in an on state;
a channel region formed in the conducting region;
a gate region formed in the substrate and doped with a second type of impurities, the gate region abutting the channel region; and
a stress layer deposited on at least a portion of the conducting region, wherein the stress layer applies a stress to the conducting region along a boundary of the conducting region that strains at least a portion of the conducting region;
the semiconductor device comprises a junction field effect transistor (JFET).

2. The semiconductor device of claim 1, wherein:
the stress layer comprises a first material having a first thermal expansion coefficient;
the conducting region comprises a second material having a second thermal expansion coefficient, and
the first thermal expansion coefficient is greater than the second thermal expansion coefficient.

3. The semiconductor device of claim 2, wherein the stress layer applies a tensile stress to the conducting region.

4. The semiconductor device of claim 1, wherein:
the stress layer comprises a first material having a first thermal expansion coefficient;
the conducting region comprises a second material having a second thermal expansion coefficient, and
the first thermal expansion coefficient is less than the second thermal expansion coefficient.

5. The semiconductor device of claim 1, wherein:
the stress layer comprises a first portion and a second portion;
the first portion of the stress layer is deposited on a first portion of the conducting region and applies a first force to the conducting region; and
the second portion of the stress layer is deposited on a second portion of the conducting region and applies a second force to the conducting region in an opposite direction to the first force.

6. The semiconductor device of claim 5, wherein the stress layer applies a compressive stress to the conducting region.

7. The semiconductor device of claim 1, wherein the stress layer comprises silicon nitride.

8. The semiconductor device of claim 1, further comprising:
a first polysilicon region in ohmic contact with the source region;
a second polysilicon region in ohmic contact with the gate region;
a third polysilicon region in ohmic contact with the drain region, and wherein the stress layer comprises a first portion deposited between the first polysilicon region and the second polysilicon region and a second portion deposited between the second polysilicon region and the third polysilicon region.

9. The semiconductor device of claim 1, further comprising a gate electrode region which overlays the semiconductor substrate, and a gate contact formed on the gate electrode region and in ohmic contact with the gate region.

10. The semiconductor device of claim 1, wherein the stress applied to the conducting region, increasing the mobility of charge carriers in at least a portion of the conducting region.

11. A method for creating a stress within a semiconductor device, comprising:
forming a source region doped with a first type of impurities in a semiconductor substrate;
forming a drain region doped with the first type of impurities in the semiconductor substrate, the drain region spaced apart from the source region;
forming a conducting region between the source region and the drain region the conducting region doped with the first type of impurities and operable to conduct current between the drain region and the source region when the semiconductor device is operating in an on state;
forming a channel region within the conducting region;
forming a gate region doped with a second type of impurities, the gate region abutting the channel region; and
depositing a stress layer on at least a portion of the conducting region that applies a stress to the conducting region along a boundary of the conducting region, wherein the stress strains at least a portion of the conducting region;
the semiconductor device comprises a junction field effect transistor (JFET).

12. The method of claim 11, wherein:
the stress layer comprises a first material having a first thermal expansion coefficient;
the conducting region comprises a second material having a second thermal expansion coefficient, and
the first thermal expansion coefficient is greater than the second thermal expansion coefficient.

13. The method of claim 12, wherein the stress layer applies a tensile stress to the conducting region.

14. The method of claim 11, wherein:
the stress layer comprises a first material having a first thermal expansion coefficient;
the conducting region comprises a second material having a second thermal expansion coefficient, and
the first thermal expansion coefficient is less than the second thermal expansion coefficient.

15. The method of claim 14, wherein the stress layer applies a compressive stress to the conducting region.

16. The method of claim 11, wherein depositing the stress layer comprises:
depositing a first portion of the stress layer on a first portion of the conducting region, wherein the first portion of the stress layer applies a first force to the conducting region; and
depositing a second portion of the stress layer on a second portion of the conducting region, wherein the second portion of the stress layer applies a second force to the conducting region in an opposite direction to the first force.

17. The method of claim 11, wherein the stress layer comprises silicon nitride.

18. The method of claim 11, further comprising:
forming a first polysilicon region in ohmic contact with the source region;
forming a second polysilicon region in ohmic contact with the gate region;
forming a third polysilicon region in ohmic contact with the drain region, and wherein depositing the stress layer comprises;
depositing a first portion of the stress layer between the first polysilicon region and the second polysilicon region; and
depositing a second portion of the stress layer between the second polysilicon region and the third polysilicon region.

19. The method of claim 11, wherein the stress applied to the conducting region, increasing the mobility of charge carriers in at least a portion of the conducting region.

20. The method of claim 11, further comprising:
forming a gate electrode region overlaying the semiconductor substrate; and
forming a gate contact on the gate electrode region and in ohmic contact with the gate region.

* * * * *